(12) United States Patent
Wang et al.

(10) Patent No.: US 11,621,161 B2
(45) Date of Patent: Apr. 4, 2023

(54) SELECTIVE DEPOSITION OF A PASSIVATION FILM ON A METAL SURFACE

(71) Applicants: Applied Materials, Inc., Santa Clara, CA (US); National University of Singapore, Singapore (SG)

(72) Inventors: Yong Wang, Singapore (SG); Andrea Leoncini, Singapore (SG); Doreen Wei Ying Yong, Singapore (SG); Bhaskar Jyoti Bhuyan, San Jose, CA (US); John Sudijono, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 238 days.

(21) Appl. No.: 17/081,482

(22) Filed: Oct. 27, 2020

(65) Prior Publication Data
US 2022/0130664 A1    Apr. 28, 2022

(51) Int. Cl.
*H01L 21/02*      (2006.01)
*C23C 16/455*    (2006.01)

(52) U.S. Cl.
CPC ............. *H01L 21/02205* (2013.01); *C23C 16/45553* (2013.01); *H01L 21/02118* (2013.01); *H01L 21/0228* (2013.01)

(58) Field of Classification Search
CPC ......... H01L 21/76883; H01L 21/02074; H01L 21/30621; H01L 21/32135; H01L 21/32136; H01L 21/31111; H01L 21/02225; H01L 21/02337; H01L 21/02334; H01L 21/76849; H01L 21/02205; H01L 21/02118; H01L 21/0228; H01L 21/02244; C23C 16/45553

USPC ........................................................ 438/768
See application file for complete search history.

(56) References Cited

U.S. PATENT DOCUMENTS

| | | | |
|---|---|---|---|
| 2004/0248428 A1* | 12/2004 | Bureau | B05D 5/12 438/780 |
| 2005/0111165 A1* | 5/2005 | Merker | H01G 9/15 361/525 |
| 2017/0098550 A1* | 4/2017 | Niskanen | H01L 21/02334 |
| 2019/0017170 A1* | 1/2019 | Sharma | H01L 21/321 |
| 2019/0148144 A1* | 5/2019 | Liu | H01L 21/321 257/632 |
| 2019/0316256 A1 | 10/2019 | Bhuyan et al. | |

(Continued)

FOREIGN PATENT DOCUMENTS

| | | | |
|---|---|---|---|
| DE | 102004022674 A1 * | 11/2005 | H01G 11/48 |
| WO | 2019036188 A1 | 2/2019 | |

OTHER PUBLICATIONS

PCT International Search Report and Written Opinion in PCT/US2021/056624 dated Feb. 16, 2022, 11 pages.
U.S. Appl. No. 17/081,494, filed Oct. 27, 2020. "Selective Deposition Of A Heterocyclic Passivation Film On A Metal Surface".

(Continued)

*Primary Examiner* — Allen L Parker
*Assistant Examiner* — David W Houston, III
(74) *Attorney, Agent, or Firm* — Servilla Whitney LLC (57) ABSTRACT

Methods of selectively depositing films on substrates are described. A passivation film is deposited on a metal surface before deposition of a dielectric material. Also described is exposing a substrate surface comprising a metal surface and a dielectric surface to a docking precursor to form a passivation film.

20 Claims, 3 Drawing Sheets

(56) References Cited

U.S. PATENT DOCUMENTS

2019/0341245 A1* 11/2019 Tois .................. H01L 21/02172
2020/0102665 A1* 4/2020 Black ...................... B05D 5/12
                                                          438/780

OTHER PUBLICATIONS

U.S. Appl. No. 17/081,506, filed Oct. 27, 2020. "Selective Deposition Of A Passivation Film".
U.S. Appl. No. 17/081,498, filed Oct. 27, 2020. "Area-Selective Atomic Layer Deposition Of Passivation Layers".
Adamkiewicz, Maigorzata, "Self-Assembled Monolayers On Silicon: Deposition and Surface Chemistry", http://hdl.handle.net/10023/3938.
Bobb-Semple, Dara, et al., "Area-Selective Atomic Layer Deposition Assisted by Self-Assembled Monolayers: A Comparison of Cu, Co, W, and Ru", Chem. Mater. 2019, 31, 1635-1645, Feb. 5, 2019.
Durainatarajan, P., et al., "Self-assembly on copper surface by using imidazole derivative for corrosion protection", Journal of Adhesion Science and Technology, 2018, vol. 32, No. 16, 1733-1749, Feb. 19, 2018.
Khuong, Kelli S., et al., "The Mechanism of the Self-Initiated Thermal Polymerization of Styrene. Theoretical Solution of a Classic Problem", J. Am. Chem. Soc. 2005, 127, 1265-1277.
Liang, Liyuan, et al., "The copper(I)-catalyzed alkyne-azide cycloaddition (CuAAC) "click" reaction and its applications. An overview", Coordination Chemistry Reviews 255 (2011) 2933-2945.
Pattison, Thomas G., et al., "Surface Initiated Polymer Thin Films for the Area Selective Deposition and Etching of Metal Oxides", ACS Nano, https://dx.doi.org/10.1021/acsnano.9b09637, Mar. 13, 2020.
Rao, B V Appa, et al., "Self-assembled 1-octadecyl-1H-benzimidazole film on copper surface for corrosion protection", J. Chem. Sci. vol. 125, No. 6, Nov. 2013, pp. 1325-1338, Aug. 21, 2013.
Winther-Jensen, Bjorn, et al., "Vapor Phase Polymerization of Pyrrole and Thiophene Using Iron(III) Sulfonates as Oxidizing Agents", Macromolecules 2004, 37, 5930-5935, Jul. 10, 2004.
Ziarani, Ghodsi Mohammadi, et al., "Advances in click chemistry for silica-based material construction", RSC Adv.. 2016, 6, 21979.

* cited by examiner

SELECTIVE DEPOSITION OF A PASSIVATION FILM ON A METAL SURFACE

FIELD

Embodiments of the disclosure relate methods for selectively depositing a passivation film. In particular, embodiments of the disclosure are directed to methods of depositing passivation films selectively on metal surfaces.

BACKGROUND

The semiconductor industry faces many challenges in the pursuit of device miniaturization which involves rapid scaling of nanoscale features. Such issues include the introduction of complex fabrication steps such as multiple lithography steps and integration of high performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

A bottom-up approach such as AS-ALD has been increasingly used to achieve patterning architectures with nanometer control. There is an ongoing need in the art for methods to improve deposition selectivity. Use of vapor self-assembled monolayer (SAM) deposition has a limitation in using SAM ligands with longer chains due to low vapor pressure for delivery. On the other hand, ligands with long chains may not be effective if the long chains are not vertically aligned using wet SAM deposition. It would be beneficial to provide improved AS-ALD processes.

SUMMARY

In a first aspect, a method of selectively depositing a film on a substrate comprises exposing a substrate surface comprising a metal surface and a dielectric surface to a docking precursor; and selectively depositing the docking precursor on the metal surface to form a docking layer, wherein the docking precursor is an aromatic hydrocarbon with a headgroup that selectively reacts and binds with the metal surface.

Another embodiment pertains to a method of selectively depositing a film on a substrate comprising exposing a substrate surface comprising a metal surface and a dielectric surface to a docking precursor; selectively depositing the docking precursor on the metal surface to form a docking layer, wherein the docking precursor is an aromatic hydrocarbon with a headgroup, wherein the aromatic hydrocarbon is a heterocyclic aromatic compound selected from the group consisting of a pyrrole, a thiophene, an aniline, and a 3,4-ethylenedioxythiophene (EDOT); and polymerizing the docking precursor of the docking layer one or more times with a chain monomer in the presence of a catalyst to deposit a passivation film.

Another aspect pertains to a non-transitory computer readable medium including instructions, that, when executed by a controller of a substrate processing chamber, causes the substrate processing chamber to expose a substrate surface comprising a metal surface and a dielectric surface to a docking precursor; and selectively deposit the docking precursor on the metal surface to form a docking layer, wherein the docking precursor is an aromatic hydrocarbon with a headgroup that selectively reacts and binds with the metal surface.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate' or "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, clean, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to a process comprising the sequential exposure of two or more reactive compounds to deposit a layer of material on a substrate surface.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

A "metal" as used herein refers to metal, metal alloy, metal oxide, metal nitride, or combination thereof, for example, comprising copper, cobalt, nickel, tungsten, vanadium, ruthenium, chromium, iron, platinum, gold, silver, molybdenum, gallium, indium, indium tin oxide, fluorine doped tin oxide and Al-doped zinc oxide. In one or more embodiments, metal oxide does not include dielectric oxides.

A "metal surface", as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate surface. In addition to the pretreatment directly on the metal surface itself, in the present disclosure, any of the metal surface treatment disclosed may also be performed on an underlayer metal surface as disclosed in more detail below, and the term "metal surface" is intended to include such underlayer as the context indicates. Thus for example, where a film/layer or partial film/layer has been deposited onto the metal surface, the exposed surface of the newly deposited film/layer becomes the metal surface.

As used in this specification and the appended claims, the phrase "selectively over", or similar, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45× or 50× the rate of formation on the non-selected surface.

Embodiments of the disclosure advantageously provide methods for surface pretreatment, such as selective blocking of metal surfaces. For blocking, the substrate is pretreated with docking precursors. The docking precursors selectively react and bind to the metal surface forming a docking layer. The docking layer further undergoes polymerization reaction with chain monomers one or more times to form a passivation layer. The method allows selective deposition of a dielectric film on a dielectric surface and not on the metal surface.

Embodiments enhance the self-assembled monolayers (SAM) passivation by progressively growing the polymer layer alongside the desired ALD film to reduce sideways growth (mushroom) issue. This can help in increasing film selectivity on target surfaces. Methods are provided for a polymer passivation layer by selecting suitable building blocks that can be deposited using an atomic layer deposition (ALD) tool alongside the desired ALD process. The molecular precursors are progressively added to bind selectively to metal surfaces (e.g., Cu, Co, etc.), but not on the dielectric (e.g., SiOx, SiN, Si, etc.) surfaces. This limits mushrooming issue commonly seen in Area-selective atomic layer deposition (AS-ALD) and allows deposition of taller features. According to embodiments, the SAM monomers for conductive polymers (polythiophene, polypyrrole, polyaniline, poly(3,4-ethylenedioxythiophene) (PEDOT)) or polystyrene are progressively introduced to build a thick passivation layer.

One or more embodiments provide methods which ease processing complexity to achieve nanometer scale control. Polymer passivation layer can be deposited by vapor-phase SAM in ALD tool which will be more compatible to other steps in semiconductor industry. This approach of polymer passivation formation may be applied in high aspect ratio films and avoids mushrooming issue with tunable thickness.

In some embodiments, the docking precursors include aromatic hydrocarbons with a headgroup that selectively reacts and binds to the metal surface. In some embodiments, the aromatic hydrocarbon includes styrene derivatives or heterocyclic aromatic compounds. In some embodiments, the heterocyclic aromatic compound may include a pyrrole, a thiophene, an aniline, a 3,4-ethylenedioxythiophene (EDOT) and a styrene derivative.

In some embodiments, non-limiting examples of the pyrrole derivative has a structure of Formula (IA), Formula (IB), Formula (IC) or Formula (ID):

(IA)

(IB)

(IC)

(ID)

The position of the headgroups is not limited to position shown. In specific embodiments, the headgroups of the pyrrole derivatives can be in the 2 position instead of the 3 position as shown above, providing a more linear polymer.

In some embodiments, non-limiting examples of the styrene derivative has a structure of Formula (IIA), Formula (IIB), Formula (IIC) or Formula (IID):

The position of the headgroups shown above for the styrene derivatives is not limited to the position shown.

In some embodiments, the headgroup may include one or more of a phosphoric acid group, a phosphoric acid ester group, a phosphonic acid group, a phosphonic acid ester group, a thiol group, a ketone group and a hydrazide group.

In some embodiments, the docking precursors selectively bind to metal, metal alloy, metal oxide, metal nitride, other conductive materials or combination thereof comprising copper, cobalt, nickel, tungsten, vanadium, ruthenium, chromium, iron, platinum, gold, silver, molybdenum, gallium and indium. In some embodiments, the docking precursors react with the metal surface in one or more of solution phase and vapor phase. In some embodiments, the substrate is exposed to a pretreatment process of cleaning, polishing, coating, doping, etching, reducing, oxidizing, hydroxylating, annealing, UV curing, e-beam curing and/or baking prior to the exposure to docking precursors. In some embodiments, the substrate is cleaned prior to exposure to the docking precursor.

In one or more embodiments, the docking layer may be deposited by any suitable method. For example, the docking layer is deposited by a chemical vapor deposition (CVD) process, a cyclical layer deposition (CLD) process or an atomic layer deposition (ALD) process. In specific embodiments, the process utilizes ALD.

Embodiments of the disclosure provide methods for selectively depositing the dielectric film on the dielectric surface of the substrate with the docking layer. The dielectric surface of the substrate may comprise any suitable dielectric materials. Suitable dielectric materials include, but are not limited to $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$ or combination thereof. In some embodiments, the dielectric surface consists of silicon oxide.

In one or more embodiments, dielectric film is deposited by any suitable method. For example, the dielectric film is deposited by a chemical vapor deposition (CVD) process, a cyclical layer deposition (CLD) process or an atomic layer deposition (ALD) process. In specific embodiments, the dielectric film is deposited by atomic layer deposition.

In some embodiments, the docking layer remains bound to the metal surface at a higher temperature, wherein the higher temperature is in the range of from: 50° C. to 100° C., 50° C. to 150° C., 50° C. to 200° C., 50° C. to 250° C., 50° C. to 300° C., 50° C. to 350° C., 50° C. to 400° C., and 50° C. to 450° C.

In some embodiments, the dielectric film is deposited on the dielectric surface after depositing the docking layer on the metal surface. The dielectric film may be a monolayer.

In some embodiments, the dielectric film is deposited by exposing the substrate with the docking layer to a dielectric reactant. In other embodiments, the dielectric film is selectively deposited on the dielectric surface after deposition of the docking layer. In some embodiments, the dielectric reactant is a silane. The silane exposed to the substrate may comprise any suitable trihydridosilane. In some embodiments, the silane comprises at least one compound with a general formula $SiH_3R$, where R is selected from C4-C20 alkyl, perfluoroalkyl, alkenyl or alkynyl groups. In some embodiments, C4-C20 alkyl groups consist essentially of one Si—C bond, C—C single bonds and C—H bonds. In some embodiments, C4-C20 perfluoroalkyl groups consist essentially of one Si—C bond, C—C single bonds and C—F bonds. In some embodiments, C4-C20 alkenyl groups consist essentially of one Si—C bond, C—C single bonds, at least one C—C double bond and C—H bonds. In some embodiments, C4-C20 alkynyl groups consist essentially of one Si—C bond, C—C single bonds, at least one C—C triple bond and C—H bonds. In some embodiments, the C4-C20 group includes one or more halogen atom and/or hydrophobic moiety. In some embodiments, the silane comprises C4-C20 alkyl groups. Non-limiting specific examples include bis(diethylamino)silane (BDEAS), tetraethyl orthosilicate (TEOS), $SiBr_4$, bis(tert-butylamino)silane (BTBAS), tetramethylsilane (TMS), tris(trimethylsilyl)silane (TTMSS), and triethoxy(fluoro)silane. In some embodiments, the silane groups cross-link with each other after deposition. In some embodiments, the docking layer contains substantially no crosslinking between the silane groups. As used in this manner, the term "substantially no crosslinking" means that there is less than or equal to about 5%, 2% or 1% crosslinking on a surface area basis. In specific embodiments, the dielectric film comprises $SiO_2$, SiN or hafnium oxide.

In some embodiments, exposing the substrate to the dielectric reactant is repeated one or more time to increase the thickness of dielectric film such that the resulting thickness of dielectric film remains lesser than, equal to or greater than the thickness of docking layer. In some embodiments, exposure of the substrate to a silane and depositing a silicon nitride layer is repeated until the silicon nitride layer has reached the thickness that is lesser than, greater than, or equal to the thickness of docking layer.

In some embodiments, the docking layer is removed from the substrate after depositing the dielectric film. The docking layer may be removed by any suitable selective etching process. Suitable selective etching processes include, but are not limited to, the use of oxygen plasmas and fluorine plasmas. In some embodiments, when oxygen plasma is used to remove the docking layer, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled. In some embodiments, the docking layer is removed by sequential exposure of the substrate to a thermal process, an oxygen plasma and/or a hydrogen plasma.

In some embodiments, the dielectric film remains bound to the dielectric surface at the higher temperature, wherein the higher temperature is in the range of from: 50° C. to 100° C., 50° C. to 150° C., 50° C. to 200° C., 50° C. to 250° C., 50° C. to 300° C., 50° C. to 350° C., 50° C. to 400° C., 50° C. to 500° C., and 50° C. to 600° C.

Another aspect of the disclosure provides enhancing self-assembled monolayer (SAM) passivation by progressively growing a passivation film alongside a dielectric film to reduce a sideways growth issue, also referred to as a mushroom issue. The passivation film is deposited by having the docking precursors of the docking layer undergo polymerization with a chain monomer in the presence of a catalyst.

In some embodiments, the catalyst is one or more of the metal surface, a catalyst coating of the metal surface and a catalyst vapor. In some embodiments, the metal surface is coated with the catalyst coating by a vapor deposition. In some embodiments, the catalyst vapor is provided with the chain monomer. In some embodiments, the catalyst comprises one or more of $Cu^{+2}$, $Fe^{+3}$, $V^{+5}$, $Mo^{+5}$ or metal complex. In some embodiments, the metal complex comprises pyridine group with one or more of $Cu^{+2}$, $Fe^{+3}$, $V^{+5}$, $Mo^{+5}$. In some embodiments, the metal complex comprises of one or more of ferric 4-pyridineethanesulfonate and ferric 3-pyridinesulfonate. In some embodiments, the structures of 4-pyridineethanesulfonate and 3-pyridinesulfonate are according to the Formula (III) and Formula (IV) respectively:

(III)

(IV)

In some embodiments, the docking layer undergoes polymerization with the chain monomer selected from the group consisting of pyrrole, thiophene, selenophene, aniline, 3,4-ethylenedioxythiophene and styrene derivative.

In some embodiments, the chain monomer comprises one or more of pyrrole, selenophene, aniline, 3,4-ethylene dioxythiophene, styrene, thiophene, 2,2'-bithiophene, thienothiophene and 3,4-dimethylthiophene derivative.

In some embodiments, the chain monomer is a styrene derivative. In some embodiments, the polymerization of the styrene derivative is performed by heating.

In some embodiments, the chain monomer is a thiophene derivative. In some embodiments, the thiophene derivative includes but not limited to thiophene, 3,4-ethylenedioxythiophene, thienothiophene, 2,2'-bithiophene and 3,4-dimethylthiophene.

In some embodiments, the passivation film remains bound to the metal surface at the higher temperature, wherein the higher temperature is in the range of from: 50° C. to 100° C., 50° C. to 150° C., 50° C. to 200° C., 50° C. to 250° C., 50° C. to 300° C., 50° C. to 350° C., 50° C. to 400° C., and 50° C. to 500° C.

In one or more embodiments, the passivation film is deposited by any suitable method. For example, the passivation film is deposited by a chemical vapor deposition (CVD) process, a cyclical layer deposition (CLD) process or an atomic layer deposition (ALD) process.

Embodiments of the disclosure provide methods for selectively depositing the dielectric film on the dielectric surface after depositing the passivation film. The dielectric surface of the substrate may comprise any suitable dielectric materials. Suitable dielectric materials include, but are not limited to $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$ or combination thereof. In some embodiments, the dielectric surface consists of silicon oxide.

In one or more embodiments, the dielectric film is deposited by any suitable method. In some embodiments, the dielectric film is deposited by a chemical vapor deposition (CVD) process, a cyclical layer deposition (CLD) process or an atomic layer deposition (ALD) process. In specific embodiments, the dielectric film is deposited by atomic layer deposition.

In some embodiments, the dielectric film is deposited on the dielectric surface after depositing the passivation film. The dielectric film may be a monolayer. The dielectric film may comprise more than one dielectric layers such that the combined thickness of the dielectric layers remains less than, greater than or equal to the thickness of passivation film.

In some embodiments, the dielectric film is deposited by exposing the substrate with the passivation film to the dielectric reactant. In other embodiments, the dielectric film is selectively deposited on the dielectric surface after deposition of the docking layer. In some embodiments, the dielectric reactant is a silane. The silane exposed to the substrate may comprise any suitable trihydridosilanes. In some embodiments, the silane comprises at least one compound with a general formula $SiH_3R$, where R is selected from C4-C20 alkyl, perfluoroalkyl, alkenyl or alkynyl groups. In some embodiments, C4-C20 alkyl groups consist essentially of one Si—C bond, C—C single bonds and C—H bonds. In some embodiments, C4-C20 perfluoroalkyl groups consist essentially of one Si—C bond, C—C single bonds and C—F bonds. In some embodiments, C4-C20 alkenyl groups consist essentially of one Si—C bond, C—C single bonds, at least one C—C double bond and C—H bonds. In some embodiments, C4-C20 alkynyl groups consist essentially of one Si—C bond, C—C single bonds, at least one C—C triple bond and C—H bonds. In some embodiments, the C4-C20 group includes one or more halogen atom and/or hydrophobic moiety. In some embodiments, the silane comprises C4-C20 alkyl groups. Non-limiting specific examples include bis(diethylamino)silane BDEAS, tetraethyl orthosilicate TEOS, $SiBr_4$, bis(tert-butylamino) silane (BTBAS), tetramethylsilane (TMS), tris(trimethylsilyl)silane (TTMSS), and triethoxy(fluoro)silane. In some embodiments, the silane groups cross-link with each other after deposition. In some embodiments, the docking layer contains substantially no crosslinking between the silane groups. As used in this manner, the term "substantially no crosslinking" means that there is less than or equal to about 5%, 2% or 1% crosslinking on a surface area basis. In specific embodiments, the dielectric film comprises $SiO_2$, SiN or hafnium oxide.

In some embodiments, the docking layer undergoes homopolymerization with a chain monomer multiple times until the passivation layer having thickness in the range of 0.5 Å to 500 Å is formed, wherein the chain monomer is selected from the group consisting of pyrrole, thiophene, selenophene, aniline, 3,4-ethylenedioxythiophene, and styrene derivative.

Figure 1:
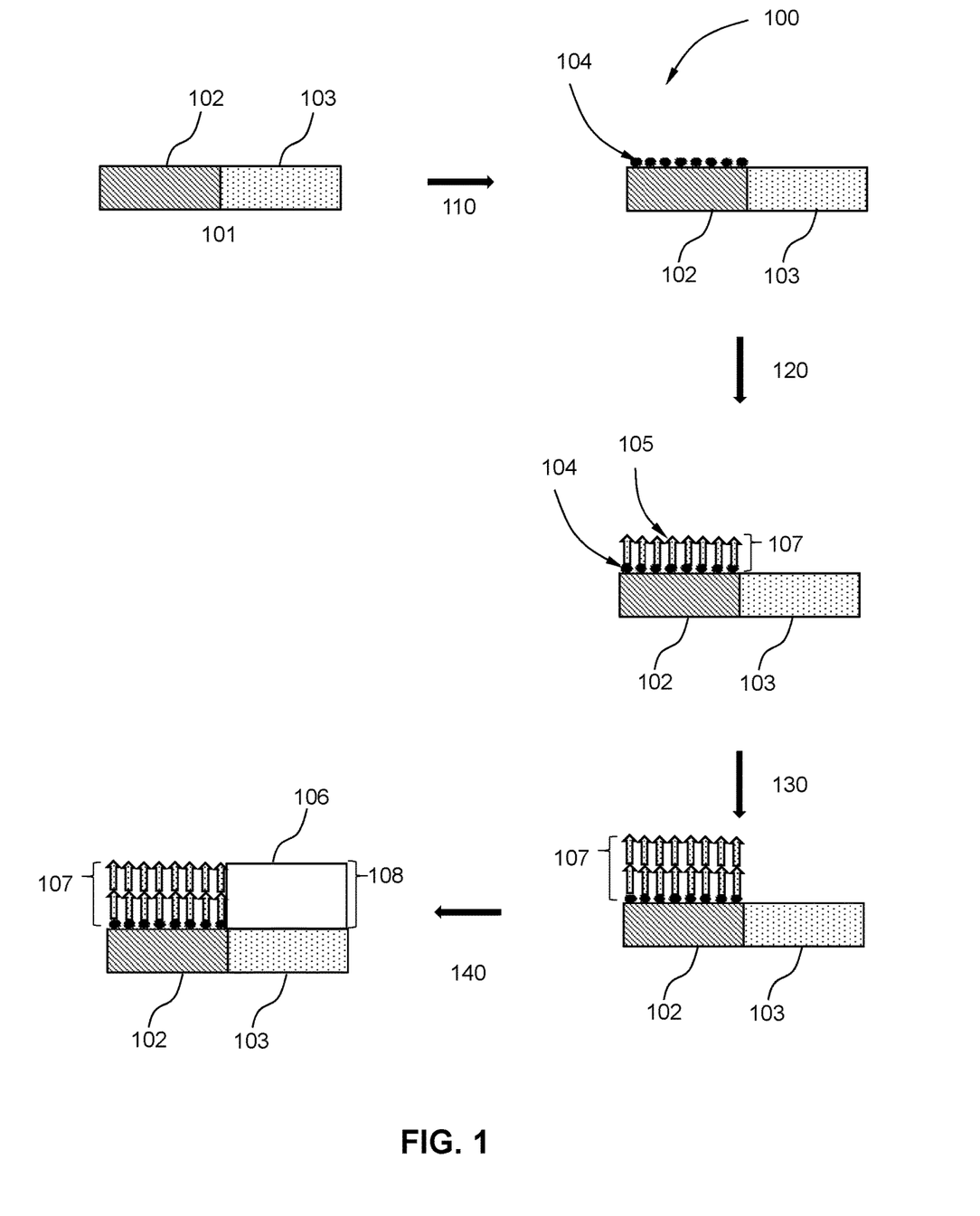
FIG. 1 shows a reaction schematic of a method for selectively depositing a passivation film on a substrate surface according to an embodiment of the disclosure.

FIG. 1 illustrates a reaction schematic of a method 100 for selectively depositing a passivation film on a substrate surface 101. The substrate surface 101 comprises a metal surface 102 (metal, e.g., Cu, Co, Ni, W, Ru, V, Cr, Fe, Pt, Au, Ag, Mo, Ga, and In etc.). The method at 110 comprises, docking precursors 104 selectively reacting and binding to the metal surface 102. The method at 120 comprises the metal surface deposited docking precursors 104 undergoing homopolymerization with chain monomers 105. The method at 130 comprises repeating homopolymerization several times until the thickness of passivation film 107 in the range of 0.5 Å to 500 Å is formed. Finally, the method at 140 comprises depositing a dielectric film 106 (e.g., $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$, etc.) on a dielectric surface 103 (eg. $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$ etc.) such that the thickness of dielectric film 108 remains equal to, less than or greater than the thickness of passivation film 107.

In one or more embodiments, the chain monomer for homopolymerization is formed by a chemical vapor deposition (CVD) process, a cyclical layer deposition (CLD) process or an atomic layer deposition (ALD) process.

In some embodiments, the docking layer undergoes heteropolymerization with at least two types of chain monomers, wherein each type of chain monomer is undergoes polymerization alternately until the passivation layer having thickness in the range of 0.5 Å to 500 Å is formed, wherein the chain monomer is one or more of pyrrole, thiophene, selenophene, aniline, 3,4-ethylenedioxythiophene, and styrene derivatives.

Figure 2:
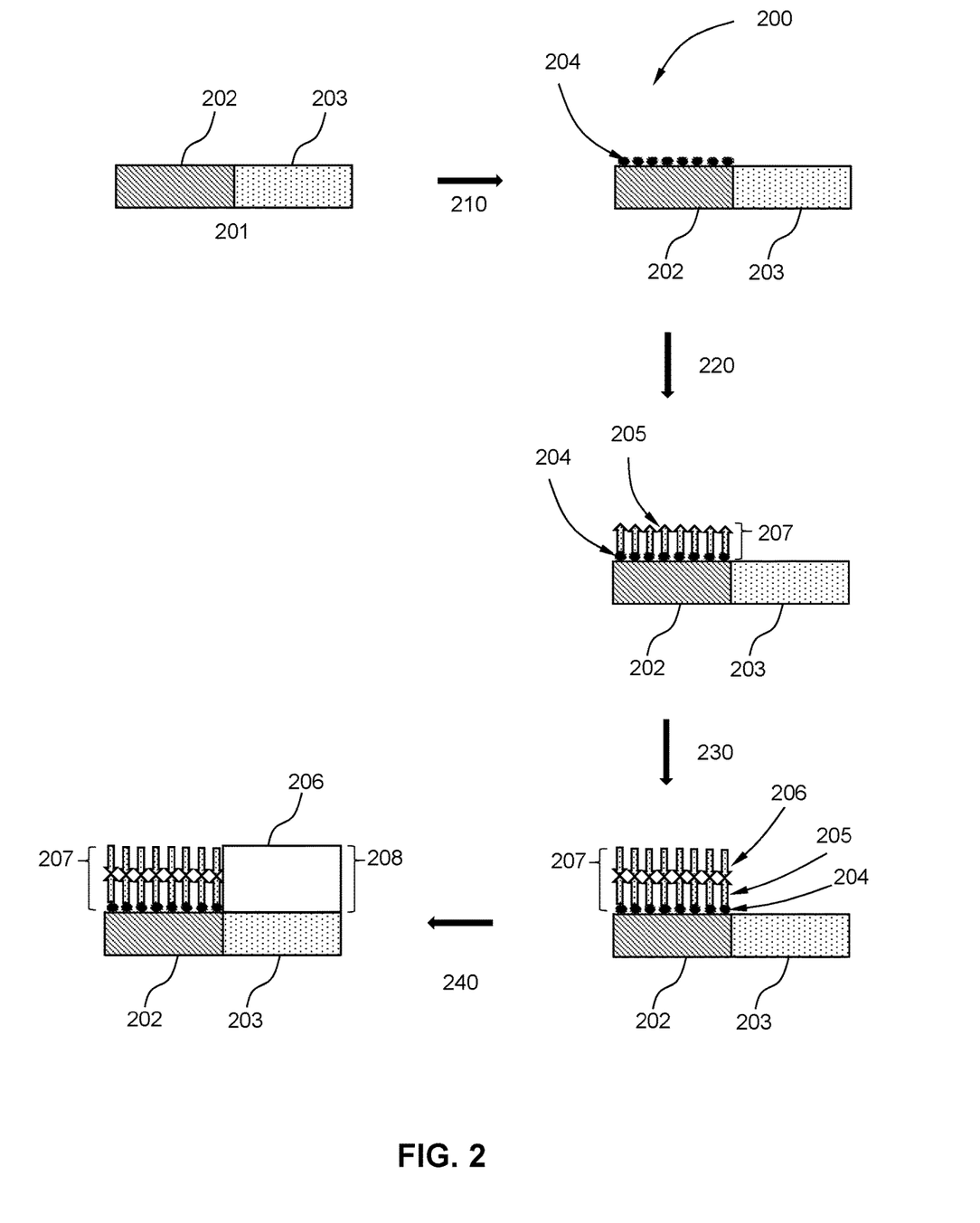
FIG. 2 shows a reaction schematic of a method for selectively depositing a passivation film on a substrate surface according to an embodiment of the disclosure.

FIG. 2 illustrates a reaction schematic of a method 200 for selectively depositing a passivation film on a substrate surface 201. The substrate surface 201 comprises a metal surface 202 (metal, e.g., Cu, Co, Ni, W, Ru, V, Cr, Fe, Pt, Au, Ag, Mo, Ga, and In etc.). The method at 210 comprises, docking precursors 204 selectively reacting and binding to the metal surface 202. The metal surface deposited docking precursors 204 then undergo heteropolymerization with a first chain monomer 205 and a second chain monomer 206 in the method at 220 and the method at 230 respectively. In some embodiments, the heteropolymerization may be repeated one or more times until the thickness of passivation film 207 is in the range of 0.5 Å to 500 Å. The method step 240 comprises depositing a dielectric film 206 (eg. $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$ etc.) on a dielectric surface 203 (eg. $SiO_x$, $Si_xN_y$, Si, SiON, $AlO_x$, $HfO_x$, $ZrO_2$, $TiO_x$, TiN, $Ta_xO_5$, $Y_2O_3$, $La_2O_3$, AlN, MgO, $CaF_2$, LiF, SrO, SiC, BaO, $HfSiO_4$, $LaAlO_3$, $Nb_2O_5$, $BaTiO_3$, $SrTiO_3$, $Bi_4Ti_3O_{12}$, $Pb(Zr, Ti)O_3$, $CaCu_3Ti_4O_{12}$, $LiNbO_3$, $BaTiO_3$, $LiNbO_3$, $KNbO_3$, etc.) such that the thickness of dielectric film 208 remains equal to, greater than or less than to the thickness of passivation film 207.

Figure 3:
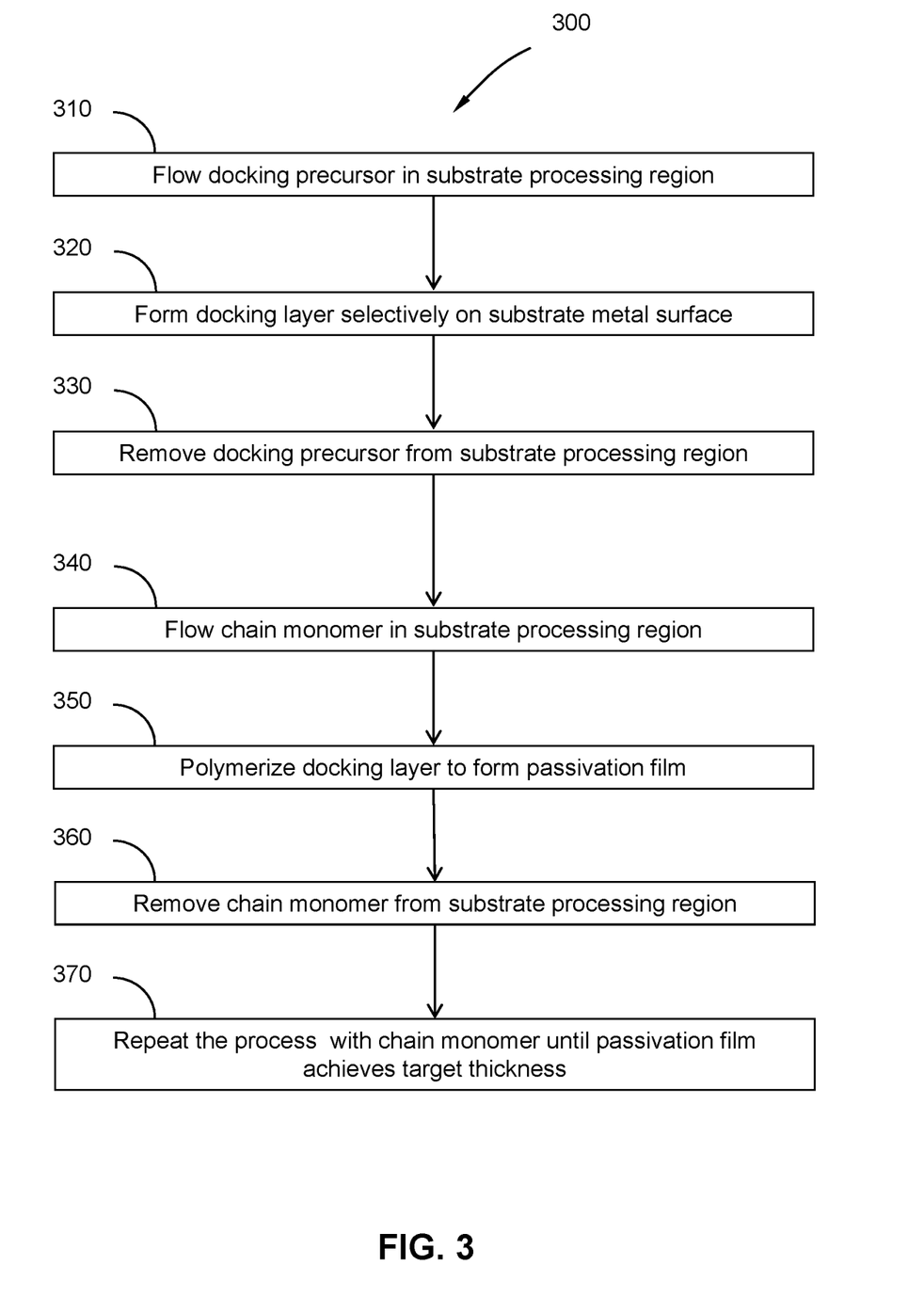
FIG. 3 is a flow chart of a method according to an embodiment of the disclosure.

FIG. 3 shows a flowchart of a method 300 according to one or more embodiments. At 310 a docking precursor is flowed in a substrate processing region, and at 320 a docking layer is selectively formed on a substrate metal surface. At 330, the docking precursor is removed from the substrate processing region, and at 340 chain monomer is flowed in the substrate processing region. At 350, the docking layer is polymerized to a passivation film, and at 360 chain monomer is removed from the substrate processing region. At 370, the process is repeated until the passivation film reaches the target thickness.

In one or more embodiments, the chain monomer for heteropolymerization is provided through a chemical vapor deposition (CVD) process, a cyclical layer deposition (CLD) process or an atomic layer deposition (ALD) process.

In some embodiments, the chain monomer of the homopolymerization or heteropolymerization is a styrene derivative. In some embodiments, the polymerization of the styrene derivative is performed by heating.

In some embodiments, the chain monomer of the homopolymerization or heteropolymerization is a thiophene derivative. In some embodiments, the thiophene derivative includes but not limited to thiophene, 3,4-ethylenedioxythiophene, thienothiophene, 2,2'-bithiophene and 3,4-dimethylthiophene.

In some embodiments, the polymerization is repeated at least one more time. In some embodiments, the polymerization is repeated up to 500 times. In some embodiments, the polymerization is repeated in the range of 1 to 1000 times, 1 to 900 times, 1 to 800 times, 1 to 700 times, 1 to 600 times, 1 to 550 times, 1 to 500 times, 1 to 450 times, 1 to 400 times, 1 to 350 times, 1 to 300 times, 1 to 250 times, 1 to 200 times, 1 to 150 times, 1 to 100 times or 1 to 50 times.

In some embodiments, the thickness of passivation film is in the range of 0.5 Å to 500 Å, 1 Å to 500 Å, 2 Å to 500 Å, 3 Å to 500 Å, 4 Å to 500 Å, 5 Å to 500 Å, 5 Å to 400 Å, 5 Å to 300 Å, 5 Å to 200 Å, 5 Å to 100 Å, 5 Å to 90 Å, 5 Å to 80 Å, 5 Å to 70 Å, 5 Å to 60 Å, 5 Å to 50 Å, 5 Å to 40 Å, 5 Å to 30 Å or 5 Å to 20 Å.

In some embodiments, the passivation film is removed after depositing the dielectric film. In some embodiments, the passivation film is removed from the substrate. The passivation film may be removed by any suitable selective etching process. Suitable selective etching processes include, but are not limited to, the use of oxygen plasmas and fluorine plasmas. In some embodiments, when oxygen plasma is used to remove the passivation film, a metal oxide layer is formed on the metal surface. In some embodiments, the metal oxide layer formed on the metal surface is removed through the use of a reduction process. Suitable reduction processes include, but are not limited to, the use of plasmas comprising hydrogen or ammonia and thermal anneals comprising hydrogen or ammonia. In some embodiments, the oxygen plasma, fluorine plasma, hydrogen plasma and ammonia plasma can be independently remotely or internally generated, and conductively coupled or inductively coupled. In some embodiments, the passivation film is removed by sequential exposure of the substrate to an oxygen plasma and a hydrogen plasma.

In some embodiments, the reaction zone is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known modular systems which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in the processing chamber of modular system, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In another aspect of a spatial ALD process, the reactive gases are delivered simultaneously to the reaction zone but are separated by an inert gas curtain and/or a vacuum curtain. The gas curtain can be combination of inert gas flows into the processing chamber and vacuum stream flows out of the processing chamber. The substrate is moved relative to the gas delivery apparatus so that any given point on the substrate is exposed to only one reactive gas.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

In a time-domain ALD process of some embodiments, exposure to each reactive gas, which includes but not limited to the docking precursor, chain monomer and dielectric reactant to be used for the dielectric film, is separated by a time delay to allow each compound to adhere and/or react on the substrate surface and then be purged from the processing chamber. The reactive gases are prevented from mixing by the purging of the processing chamber between subsequent exposures.

In another aspect of a time-domain ALD process of some embodiments, a time delay exists between pulses of reactive gases. During each time delay, a purge gas, such as argon, is introduced into the processing chamber to purge the reaction zone or otherwise remove any residual reactive gas or reaction products or by-products from the reaction zone. Alternatively, the purge gas may flow continuously throughout the deposition process so that only the purge gas flows during the time delay between pulses of reactive gases. The reactive gases are alternatively pulsed with a pulse of purge gas there between until film thickness in the range of 0.5 Å to 500 Å is formed on the substrate surface.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the passivation film is deposited, the method may optionally include further processing (e.g., bulk deposition of a dielectric film). In some embodiments, the further processing may be an ALD process. For example, in some embodiments, an ALD process may be performed to bulk deposit a silicon nitride layer to a target thickness. In specific embodiments, a process comprises flowing a pulse of a docking precursor, followed by purging with a nitrogen and/or argon gas, flowing a dielectric reactant, followed by purging with a nitrogen and/or argon gas. The purge may also be conducted by applying a vacuum, without flowing gas.

In one or more embodiments, the processes described herein may generally be stored in the memory as a software routine that, when executed by a controller or processor, causes a substrate processing chamber to perform one or more processes described in the present disclosure. The software routine may also be stored and/or executed by a second controller or processor (not shown) that is remotely located from the hardware being controlled by the controller or processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general purpose computer into a specific purpose computer (controller) that controls the chamber operation such that the processes are performed. The processes may be stored on a non-transitory computer readable medium including instructions, that, when executed by a controller of a substrate processing chamber, causes a substrate processing chamber to perform one or more of the methods described herein.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of selectively depositing a film on a substrate, the method comprising:
   exposing a substrate surface comprising a metal surface and a dielectric surface to a docking precursor; and
   selectively depositing the docking precursor on the metal surface to form a docking layer, wherein the docking precursor is an aromatic hydrocarbon with a headgroup that selectively reacts and binds with the metal surface, wherein the docking precursors of the docking layer further undergo polymerization to form a passivation film, and the polymerization is repeated one to 1000 times with a chain monomer in the presence of a catalyst, and wherein each polymerization comprises the same chain monomer or alternating at least two types of chain monomers.

2. The method of claim 1, wherein the aromatic hydrocarbon is selected from the group consisting of styrene derivatives and heterocyclic aromatic compounds.

3. The method of claim 1, wherein the aromatic hydrocarbon is a heterocyclic aromatic compound selected from the group consisting of a pyrrole, a thiophene, an aniline, and a 3,4-ethylenedioxythiophene (EDOT).

4. The method of claim 1, wherein the headgroup comprises one or more of a phosphoric acid group, a phosphoric acid ester group, a phosphonic acid group, a phosphonic acid ester group, a thiol group, a ketone group and a hydrazide group.

5. The method of claim 1, wherein the metal surface comprises one or more of copper, cobalt, nickel, tungsten, vanadium, ruthenium, chromium, iron, platinum, gold, silver, molybdenum, gallium and indium.

6. The method of claim 1, wherein the forming the passivation film comprises a vapor deposition reaction selected from the group consisting of a chemical vapor deposition reaction and an atomic layer deposition reaction.

7. The method of claim 6, wherein the catalyst comprises one or more of the metal surface, a catalyst coating of the metal surface and a catalyst vapor.

8. The method of claim 7, wherein the catalyst comprises a catalyst formed by a vapor deposition on the metal surface.

9. The method of claim 8, wherein the catalyst vapor is provided with a chain monomer.

10. The method of claim 6, wherein the catalyst comprises one or more of $Cu^{+2}$, $Fe^{+3}$, $V^{+5}$, $Mo^{+5}$, $Mo^{+6}$ or a metal complex.

11. The method of claim 10, wherein the metal complex comprises pyridine group with one or more of $Cu^{+2}$, $Fe^{+3}$, $V^{+5}$, $Mo^{+5}$, $Mo^{+6}$.

12. The method of claim 11, wherein the metal complex comprises one or more of ferric 4-pyridineethanesulfonate and ferric 3-pyridinesulfonate.

13. The method of claim 6, wherein the chain monomer comprises one or more of pyrrole, thiophene, selenophene, aniline, 3,4-ethylenedioxythiophene, and styrene derivatives.

14. The method of claim 6, wherein the chain monomer is a thiophene derivative selected from the group consisting of thiophene, 3,4-ethylenedioxythiophene, thienothiophene, 2,2'-bithiophene and 3,4-dimethylthiophene.

15. The method of claim 6, wherein the thickness of the passivation film is in the range of 5 Å to 100 Å.

16. The method of claim 6, wherein forming the docking layer includes multiple homopolymerization reactions.

17. The method of claim 6, wherein forming the docking layer includes multiple heteropolymerization reactions.

18. A non-transitory computer readable medium including instructions, that, when executed by a controller of a substrate processing chamber, causes the substrate processing chamber to perform the method of claim 1.

19. A method of selectively depositing a film on a substrate, the method comprising:
    exposing a substrate surface comprising a metal surface and a dielectric surface to a docking precursor;
    selectively depositing the docking precursor on the metal surface to form a docking layer, wherein the docking precursor is an aromatic hydrocarbon with a headgroup comprising one or more of a phosphoric acid group, a phosphoric acid ester group, a phosphonic acid group, a phosphonic acid ester group, a thiol group, a ketone group and a hydrazide group; and
    polymerization of the docking precursors of the docking layer with a chain monomer in the presence of a catalyst to deposit a passivation film and repeating the polymerization one to 1000 times, wherein the chain monomer in each polymerization is selected from the same chain monomer or at least two types of chain monomers that are alternated.

20. A method of selectively depositing a film on a substrate, the method comprising:
    exposing a substrate surface comprising a metal surface and a dielectric surface to a docking precursor; and
    selectively depositing the docking precursor on the metal surface to form a docking layer, wherein the docking precursor is an aromatic hydrocarbon with a headgroup, wherein the aromatic hydrocarbon is a heterocyclic aromatic compound selected from the group consisting of a pyrrole, a thiophene, an aniline, and a 3,4-ethylenedioxythiophene (EDOT); and
    polymerization of the docking precursor of the docking layer with a chain monomer in the presence of a catalyst to deposit a passivation film and repeating the polymerization one to 1000 times, wherein the chain monomer in each polymerization is selected from the same chain monomer or at least two types of chain monomers that are alternated.

* * * * *